United States Patent
Johnson et al.

(10) Patent No.: US 7,242,188 B1
(45) Date of Patent: Jul. 10, 2007

(54) INTEGRATED GRADIOMETER ARRAY

(75) Inventors: Mark B Johnson, Springfield, VA (US); Michael M Miller, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/470,128

(22) Filed: Sep. 5, 2006

Related U.S. Application Data (62) Division of application No. 10/206,456, filed on Jul. 29, 2002, now Pat. No. 7,126,331.

(51) Int. Cl.
*G01R 33/07* (2006.01)
*G01R 33/02* (2006.01)

(52) U.S. Cl. ................ 324/251; 324/252; 324/244

(58) Field of Classification Search ........ 324/251–252, 324/244
See application file for complete search history.

(56) References Cited

U.S. PATENT DOCUMENTS

| | | | |
|---|---|---|---|
| 4,692,702 A | 9/1987 | Huschelrath et al. | |
| 5,652,445 A | 7/1997 | Johnson | |
| 5,807,758 A | 9/1998 | Lee et al. | |
| 5,833,603 A | 11/1998 | Kovacs et al. | |
| 5,981,297 A | 11/1999 | Baselt | |
| 6,064,083 A | 5/2000 | Johnson | |
| 6,468,809 B1 | 10/2002 | Prinz et al. | |
| 6,800,913 B2 | 10/2004 | Johnson et al. | |
| 2001/0033159 A1 | 10/2001 | Forrest et al. | |

*Primary Examiner*—Bot LeDynh
(74) *Attorney, Agent, or Firm*—John J. Karasek; L. George Legg (57) ABSTRACT

Magnetic field sensors, each generating an electrical output signal in proportion to the local magnetic field, are lithographically fabricated on a semiconductor substrate with a small spatial separation. The lateral dimension of the sensors and the separation length are the order of the minimum lithographic feature size. Comparing the electrical signals to the sensors results in a measurement of the local magnetic field gradient. Large field gradients, that vary on a small spatial scale, may be associated small magnetic structures such as microscopic magnetic particles. Detection of a field gradient can be used to infer the presence of a magnetic particle.

5 Claims, 4 Drawing Sheets

INTEGRATED GRADIOMETER ARRAY

FIELD OF THE INVENTION

The present invention relates to an integrated sensor and method for measuring magnetic field gradients. More particularly, the present invention is directed to sensing and measuring magnetic field gradients that spatially vary on a length scale of 10 microns or less, such as are generated by microscopic magnetic particles that may be bound to a target species for identification.

BACKGROUND OF THE INVENTION

There is an increasing demand for the ability to detect magnetic fields that vary on a small spatial length scale of d μm, where d may vary from the order of 0.01 microns (10 nm) to the order of 10 microns. As one particular example, fields that vary on such a scale are associated with the magnetic moment of magnetic particles (MPs) of diameter d. One method for detecting the presence of such a particle is to sense the accompanying, local magnetic field. These particles, in turn, may be used for a variety of applications, such as "tagging" biological or chemical targets. Thus, sensing the presence and/or location of magnetic "tags" permits the identification of the associated target. The background are essentially involves two categories, the use of individual sensors to detect local magnetic fields, and common gradiometric techniques used for measuring field and field gradients that vary on a macroscopic scale.

Regarding the first category, the prior are describes the use of individual field sensors for the specific application of detecting magnetic particles. Criteria for suitably designed sensors are known to those skilled in the art. It is generally desirable to fabricate a magnetic field sensors that can be located inclose proximity to the particle, within a length scale of order d, and furthermore the size scale of the sensor itself must be of order d. U.S. Pat. No. 5,981,297. Baselt, describes a scheme using magnetioresistive sensors for the specific application of detecting magnetic particles that are used to tag biological agents. U.S. patent application Ser. No. 09/497,754, filed Feb. 4, 2000, by G. A. Prinz and M. M. Miller, describes a specific type of sensor configuration and teaches critical details for realizing such a sensor. In both these disclosures, Giant Magnetoresistance (GMR) sensors are a preferred embodiment. The advantage of GMR is its relatively large magnetoresistive effect and the associated high sensitivity that, in general, surpasses that of Hall effect devices. However, the sensitivity of a GMR element is compromised when the device is fabricated on a small scale because of magnetostatics. For example, a sensor that is many microns in size may be capable of detecting magnetic fields that are uniform over the sensor in the n'1' range. However, the fringing field from a MP that is locally highly non-uniform becomes problematic for several reasons. First, if the active area of the sensor is much larger than the MP then the magnetoresistance induced from the fringing field is largely shunted out by the unperturbed portion of the sensor. Furthermore, if the MP is extremely small the highly localized fringing field will be unable to affect a comparably small portion of the sensor. This is because the magnetic moments in the sensor cannot be arbitrarily rotated at a greater spatial variation than that allowed by the exchange interaction. Second, when the GMR sensor has dimensions on the order of d the micromagnetic configuration of the sensor becomes the dominant concern as d becomes very small. Any conceivable GMR sensor element will have to overcome magnetostatic demagnetization barriers in either the "quiescent" state or when the magnetic moments are either reversing or rotating in response to the MP. For many reasons, fabrication of GMR devices become extremely difficult for length scales d less than 1 microns.

Regarding the second category, techniques of gradiometry, using devices called gradiometers, are well known and used for measurements of fields and field gradients on macroscopic length scales of order 1 cm and larger. On a smaller length scale, several gradiometers designated for use as read heads for reading out bits of data stored on magnetic media have been described in the literature. These designs do not use sensors that are integrated on a common chip. This application typically involves a sensor fabricated on the head of a mechanical servo arm with tracks of magnetic bits moving below the arm. These read head gradiometers have not proven to be commercially successful.

In general terms, a gradiometer is a magnetic field measurement system composed of n subsystems such that different linear combinations of the n sensed values correspond to measurements of magnetic fields that are spatially invariant (zeroeth mathematical moment), have a first order gradient (first moment), second order gradient (second moment), etc. A simple gradiometer with two such subsystems or components, A and B, can obtain a measurement discriminating between magnetic fields that are either spatially constant or varying. Such a two component system describes the vast majority of available gradiometers. Each component A or B can be formed of any of a variety of common magnetic field sensors, such as inductive loops, magnetoresistors or Hall plates, and the associated electronics. Because the spatial separation of components A and B determines the length scale over which a field gradient is measured, the expected length scale of a given measurement often determines the selection of sensor. For example, a pair of inductive coils that is wound with diameter of 2 mm, a thickness of 0.5 mm for each coil and a separation of 1 mm between coils is appropriate for measuring fields with gradients that vary on a length scale of order 1 mm. In any specific application of a gradiometer, values of voltage measurements $V_A$ and $V_B$ taken from subsystems A and B, respectively, are used to form linear combination $V_{0,1}=V_A+/=V_B$, where voltages $V_0$ and $V_1$ represent measurements of spatially constant and nonconstant magnetic fields, respectively, and where the relative signs of $V_A$ and $V_B$ depend on their configuration such that subscripts 0 and 1 may be interchanged accordingly.

Accordingly, a gradiometer is typically composed of two elements that are capable of sensing a magnetic field, in a geometry where magnetic fields that vary on a long spatial scale are nulled but fields that vary on a short spatial scale are measured. For the integrated gradiometer, several different kinds of devices are available for the sensing of magnetic fields. Examples that operate at room temperature include inductive coils and a variety of magnetoresistors, including anisotropic magnetoresistive elements, spin valves and magnetic tunnel junctions. A third family of devices is one of the oldest commercial field sensors, the Hall plate. The family of Hall devices includes dozens, if not hundreds, of patented variations [see, for example, R. S. Popovic. "Hall-effect Devices." Sens. Actuators 17, 39 (1989); R. S. Popovic. "Hall Effect Devices" (Adam Hilger, Bristol, 1991)].

A "double layer Hall sensor array" cryogenic device has been reported in the literature [Y. Abulafia et al., APL 72. 2891 (1998)], where the device was used to measure two magnetic field components (in-plane, or x, and perpendicular-to-plane, or z) associated with macroscopic superconducting samples. The device incorporated a series array of 5 structures, each composed of two vertically stacked Hall crosses with transverse dimensions of 10 μm, where each of the two layers was a two dimensional electron gas (2DEG) designed to operate at cryogenic temperatures, and the two "layers" were separated by an insulating layer with a thickness of 1'~1 μm. A superconducting sample with dimensions of order 1 mm was placed over the array. Hall measurements from each pair of sensors were individual recorded. They were used to calculate the gradient of the z component at the five x-positions that corresponded to the five pairs, and the x component of field was then calculated. The x- and z-components of magnetic field at the surface of the sensor array were reported. The z-component of field associated with the macroscopic sample had a gradient that varied on a spatial scale of about 10 microns. The device has several shortcomings. It operates at cryogenic temperatures. It is not capable of measuring the field gradients, that vary on a spatial scale less than 10 microns, associated with magnetic particles because the transverse dimensions are too large. The device does not operate using a comparison mode, whereby the voltages of both sensors of a pair are automatically summed or subtracted giving an output in proportion to the field and field gradient, and the device is not used along with an application of a constant external field (all measurements are in zero external field).

SUMMARY OF THE INVENTION

An object of the invention is to provide a micro- or nano-fabricated, integrated gradiometer that is sensitive to magnetic fields that vary on a small length scale d, where d is the the order of 0.01 to 10 μm.

Another object of the invention is to provide a micro- and nano-fabricated, integrated gradiometer that can sense locally varying magnetic fields in the presence of an externally applied constant magnetic field.

Another object of the invention is to provide a micro- or nano-fabricated, integrated gradiometer that can sense magnetic fields that vary locally with a spatial scale d, but is not sensitive to background, ambient fields that vary on a longer spatial length scale.

Yet another object of the invention is to provide a microfabricated gradiometer that is sensitive to the fringe magnetic fields associated with micro- or nano-scale magnetic particles, such as those used to "tag" biological or chemical agents.

Another object of the invention is to provide a microfabricated gradiometer with high spatial resolution that can be scanned across an area that includes a target object. A specific application is a target that has been "tagged" with magnetic particles, and by scanning the area the target can be identified from the spatial map of locally varying magnetic fields.

Yet another object of the invention is to provide a two-dimensional array of gradiometer cells for high spatial resolution of objects that have local magnetic fields that vary on a small spatial scale. Integrated readout of the sensors allows rapid readout of the array. A specific application is the recognition of microscope magnetic particles that have been used to tag an object to be identified.

These objects and others are realized by, according to the invention, an integrated gradiometer for measuring a magnetic field gradient associated with a magnetic field that includes a semiconducting substrate, a first sensor and a second sensor, each fabricated on the semiconducting substrate and responsive to the presence of the magnetic field, and a comparator. The first and second sensors are spaced apart at a distance effective for measuring a magnetic field gradient having a spatial scale of up to about 10 μm. The first sensor produces a first electrical signal proportional to a first magnetic field strength of the magnetic field, while the second sensor produces a second electrical signal proportional to a second magnetic field strength of the magnetic field. The comparator receives and compares the first and second electrical signals, producing an output representing the magnitude of the magnetic field gradient applied across the sensors.

The integrated gradiometer, by comparison with simple magnetic field sensors, has numerous advantages. It is ideally suited to the measurement of magnetic fields that vary on a small length scale, and to the discrimination of such fields against larger background fields that are spatially constant (or slowly varying).

The invention applies established techniques of magnetic gradiometry to small length scales using integrated structures fabricated by micro- or nano-lithography. These structures are well suited to measuring the fringe fields associated with small magnetic particles, but are not limited to this application.

The integrated gradiometer of the invention has unique features that are important in several ways. (1.) It is sensitive to the measurement of field gradients that vary on a small length scale d. (2.) it is capable of screening out relatively large fields $H_1$ that vary on a longer length scale, and that may be intrinsic to the environment of the application. For example, such a field may be intrinsic to the particular application environment of the magnetic, tag particles. (3.) It is capable of screening out relatively large fields $H_a$ that may be externally applied as a part of the measurement. For example, it may be desirable to apply such a field in order to develop, or intensify, an appropriate magnetic moment in a magnetic particle of a composition particularly appropriate to a given application.

Also, the invention includes specific embodiments of particular usefulness. Hall plates are magnetic field sensors with good properties for scaling to small dimensions. Two such examples of the design and fabrication of integrated Hall gradiometers are described below.

A single, integrated gradiometer has functionality over a new range of length scales and has a wide range of applications. The fabrication of arrays of integrated gradiometers further extends the range of applications. Fabricated on a single chip, each gradiometer in a (typically) two dimensional array can be individually addressed and its measurement can be read and stored. In this way, a map of field gradients that vary locally on the small length scale d can be made for a large area $10^n \backslash d^2$, where n may range from 4 to 8, and this map can be used to identify biological or chemical targets, or magnetic characteristics of a generic physical system.

The invention also extends to the concept of an integrated gradiometer in which a gradiometer is the basic component of a cell, and one or two dimensional arrays of cells are fabricated and used.

The present invention is optimized for detecting field gradients associated with MPs. It has layer separations of about 1'>1 μm, transverse dimensions less than 10 μm, and it is operated at room temperature with the application of an external magnetic field [[note—generally we want the range of external field to include zero] and using a comparator readout mode, thus providing performance improvements over alternative devices.

The invention provides a new gradiometric techniques and devices using combinations of integrated field sensors for detecting and measuring magnetic fields and field gradients that vary on a small spatial scale. This improves over the prior art devices that either use individual sensors to detect local magnetic fields or common gradiometric techniques for measuring field and field gradients that vary on a macroscopic scale.

Also, the present invention unlike the device disclosed in Abulafia et al discussed above is, in a preferred embodiment, a vertical stack of Hall sensors capable of and optimized for detecting field gradients associated with MPs at room temperature. It has layer separations 1' of 1 μm or less, transverse dimensions less than 10 μm, and is fabricated for operating at room temperature. It includes an astatic geometry for nulling out an external, constant magnetic field, thereby enabling susceptibility techniques.

Accordingly, new trends in the applications of magnetic materials have created a need for novel measurements on microscopic length scales. Techniques of micro- and nano-fabrication are developing rapidly, and the incorporation of these fabrication techniques with the basic concepts of gradiometry to create integrated gradiometers can meet these novel needs. The invention meets these needs.

DETAILED DESCRIPTION OF THE PREFERRED EMBODIMENTS

As used herein, the term "local magnetic field source" refers to a microscopic magnetized object that generates a local magnetic field with an associated field gradient. An example is a microscopic magnetic particle, with diameter of order 10 nm up to 5 microns. Where reference is made herein to first and second sensors that are spaced apart at a distance effective for measuring a magnetic field gradient having a spatial scale of d microns, the meaning is as follows. The locally strong magnetic fields associated with microscopic magnetic particles, or generally any microscopic magnetic structure, can be modeled as coming from a superposition of sources characterized as monopole or dipole. Typically, components from dipolar sources dominate the characteristics of the local field. The spatial scale d that defines the dipole is a characteristic length scale for the spatial variation of the local magnetic field. It has been noted that the lateral dimensions of the first and second sensors should be d or smaller, to avoid averaging the field over an area so large that spatial resolution is lost. The separation between the first and second sensors should also be of order d. If the separation is larger than d, one sensor acts essentially as a null detector. This size scale can be used, for example, when an external field is applied in order to increase the moment of a paramagnetic source. The detection of a particle is permitted, but there is no spatial resolution of the field gradient. A separation of less than d, for example d/4 or d/2, is optimal for a quantitative measurement of the field gradient. As an example, measuring the field gradient of a magnetic particle with diameter of 2 microns would employ two sensors spatially separated by a distance of ½ to 1 micron.

Figure 1:
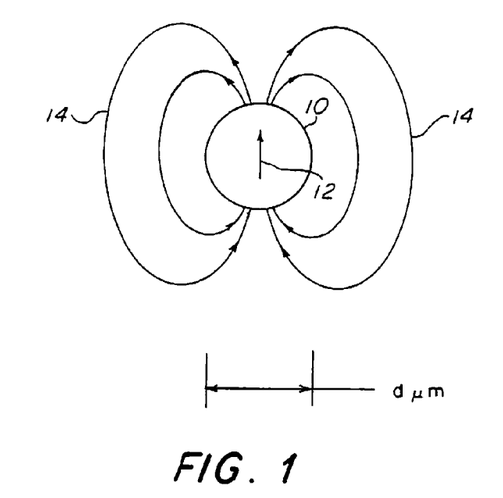
FIG. 1 is a schematic, cross-sectional view of a magnetic particle and the dipolar, fringe magnetic fields associated with the particle.

FIG. 1 shows a magnetic particle MP 10 with diameter d. In some cases, d represents the full diameter of the particle and, in other embodiments, d includes a coating or membrane that functionalizes the MP. Its magnetic moment (m) 12 may be a spontaneous moment or it may develop in proportion to an externally applied magnetic field. If the moment is spontaneous the orientation of the moment may be random, but may be manipulated by local or external fields. If the moment is induced using an externally applied magnetic field, the moment will typically align with this field with the strength of the moment being proportional to the applied field. Below we will discuss these issues in greater detail. It's reasonably to approximate the moment as a dipole, and the fringe magnetic fields associated with m are also sketched in FIG. 1. The important point is that the dipolar fringe fields 14 have a strong spatial variation on the length scale d.

Very near the surfaces of MP 10, the fringe field 14 magnitude has approximate value $B(r=d/2) \sim 4\pi M$ (M is the volume magnetization, $M=|m|/V$) which may be the order of 0.01 to 1 tesla. Because of its dipolar nature, $B \sim (1/r^3)$, the fringe field 14 decays by orders of magnitude within a distance of several d. It follows that (i) the field gradient $\delta B/\delta r$ is large, and (ii) the particle's fringe field may become undetectable at distances greater than a few d. Thus, it is generally desirable to fabricate a field sensor that can be located in close proximity to the particle, within a length scale of order d, and the size scale of the sensor itself must be of order d.

Figure 2:
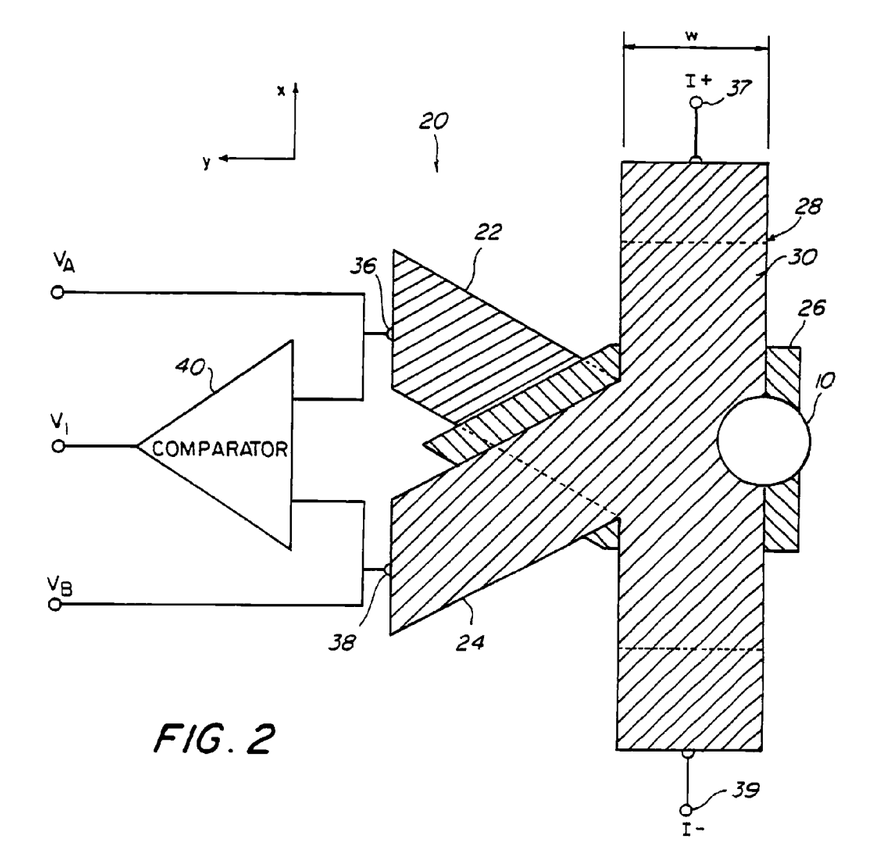
FIG. 2 is a top view of a preferred embodiment of an integrated gradiometer using a vertical stack arrangement of Hall cross sensors.

FIG. 2 shows a top view of a vertically stacked integrated gradiometer 20 as in the invention. A MP 10 of diameter d=20 nm is on top of two stacked Hall crosses 22 and 24, each fabricated with arm width W=1.5×d. The bottom Hall cross 22, also referred to herein as sensor A, is isolated from the top Hall cross 24, also referred to herein as sensor B, in a sampling region 25 by a thin insulating layer 26. The vertical arms 28 and 30 (arm 28 is positioned under arm 30 with its position indicated by the arrow) of respective crosses 22 and 24, shown here as carrying current bias I, are in contact outside the sampling region 25. The horizontal arm 32 and 34 of each respective Hall cross 22 and 24 is independently contacted and connected to one or more sense amplifiers (not illustrated). bottom Hall cross 22 delivers an output voltage proportional to the magnetic field averaged over its active area to terminal 36, where it can be transmitted to sensing circuit A. Top Hall cross 24 delivers an output voltage proportional to the magnetic field averaged over its active area to terminal 38, where it can be transmitted to sensing circuit B. If there is a magnetic field with component along +/− z in the sampling region 25, carries contributing to the bias current I, applied from I+ (terminal 37) to I− (terminal 39), experience a Lorentz force and a Hall effect generates voltages $V_A$ and $V_B$ in sensors A and B. As shown in FIG. 2, $V_A$ and $V_B$ can be independently sensed (and summed, if desired) to measure the z-component of field averaged over the sampling region. By applying $V_A$ and $V_B$ to a simple comparator 40, the difference $V_1=V_A-V_B$ can be sensed and amplified, resulting in a measure of local field gradients, associated with the MP, that cause different field values in sensors A and B.

Figure 3:
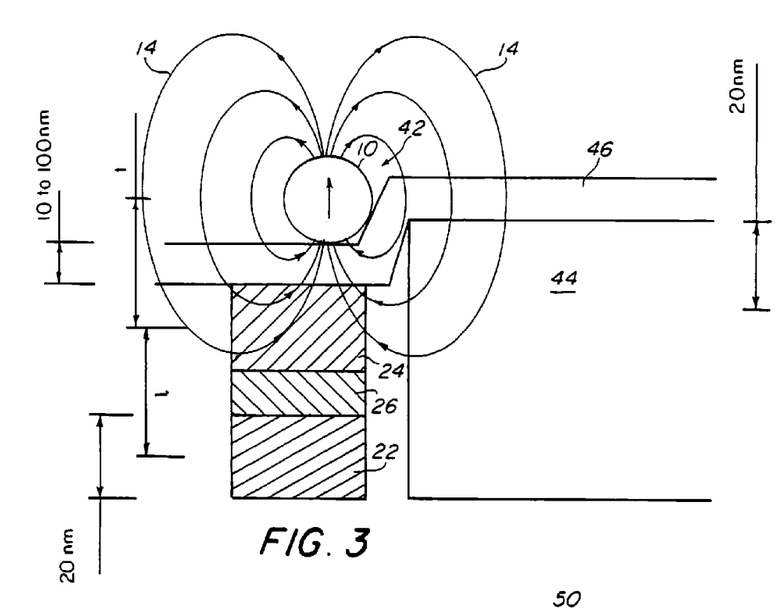
FIG. 3 is a cross-sectional view of the embodiment of FIG. 2.

FIG. 3 presents a cross sectional view of the device of FIG. 2. In this embodiment, the stacked Hall crosses 22 and 24 may be fabricated using thin films of, for example, bismuth, separated by a thin layer of dielectric 26. Alternatively, they may be fabricated using a semiconductor heterostructure such as a double quantum well, further described below. In this case, a quantum well is used for the conducting layers 22 and 24 and the isolation between sensors A and B is provided by a barrier layer 26 in the heterostructure. A topographic "ridge" 42 may be used to help localize MPs and guide them to the region of the gradiometric detector. The ridge may be associated with a fabricated circuit component 44 that may have some magnetic characteristics. A thin film 46 is used to coat the surface. The film may include a dielectric layer to protect the gradiometer from the chemical environment in which the MPs reside. It may also include a biological or chemical coating chosen to interact with the functionalized MP. FIG. 3 is shown approximately to scale, and one sees that the local fringe fields 14 associated with the MP can be have components $B_2$ in the vicinity of sensor 24 (B) that are substantially larger than those in the vicinity of sensor 22 (A). Although the MP in FIG. 3 has been sketched with a moment m 12 aligned along z, it is clear that an arbitrary orientation of m will also result in gradients of fringe field $B_z$ in the vicinity of the gradiometer. It should be noted, and will be further discussed below, that an external field $H_z$ may be used to align the moment m (or develop a moment m) in a preferred direction. This gradiometer will be insensitive to the presence of $H_z$, but will still measure field gradients that are associated with the moment. The gradiometer will also be insensitive to magnetic fringe fields that might be associated with circuit components 44 that may be a magnetic characteristic.

The embodiment shown in FIG. 3 may be fabricated with thin films of a material, such as bismuth, that has a low carrier concentration n and, therefore, a large Hall coefficient $R_H \alpha 1/n$. Alternatively, a gradiometer of this "stacked" configuration can also be fabricated using a semiconducting heterostructure known as a double quantum well (DQW). These semiconducting structures are well known in the literature. Two epitaxially grown quantum wells are isolated by a thin dielectric layer of t~10 to 100 nm, and a top barrier layer with thickness of order 50 nm confines the carriers and protects the DQWs from agents on the surface. It is typically difficult to achieve carrier densities in both quantum wells that are exactly equal. Any difference in density would correspond to a constant voltage offset, and renormalization would be necessary to deduce values of constant field $B_z$.

Variations from this constant offset would be identified with the detection of a field gradient. Unlike the "double layer" cryogenic device described above [Y. Abuliafa et al. APL 72, 289 (1998)], where the device was used to measure the field and field gradients associated with macroscopic superconducting samples, the preferred embodiment of the present invention is optimized for detecting field gradients associated with MPs. It has layer separations l'>1 μm, transverse dimensions less than 10 μm, and is operated at room temperature, typically in the presence of an externally applied magnetic field.

Figure 4:
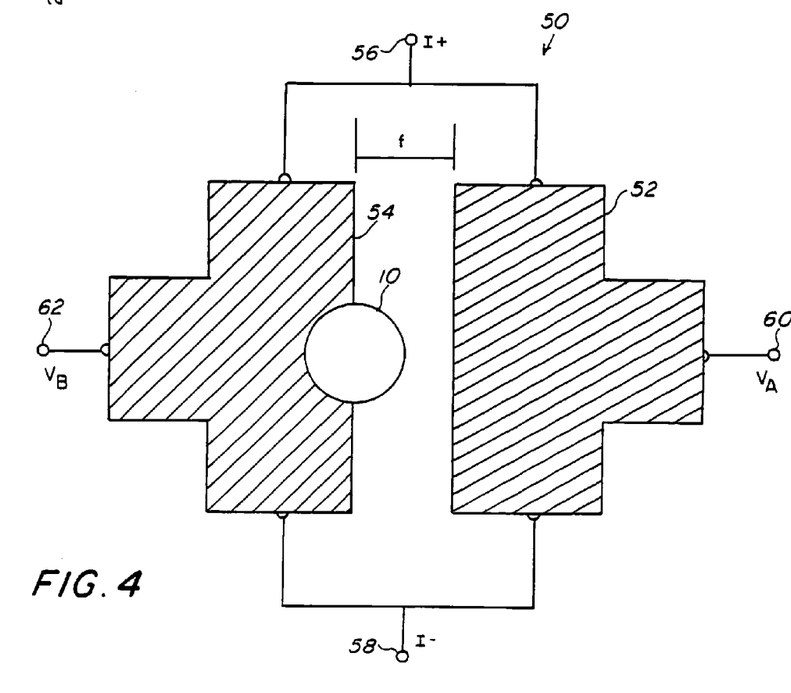
FIG. 4 is a top view of a second preferred embodiment of an integrated gradiometer using a lateral arrangement of Hall cross sensors.

FIG. 4 shows a top view of a second preferred embodiment of an integrated gradiometer, a lateral geometry 50. Two micro- or nano-fabricated sensors (Hall sensors 52 and 54) are fabricated next to each other, with edge to edge separation minimized to a convenient lithographic length scale, typically the minimum feature size f. These sensors are current biased in parallel, from a terminal 56 to a terminal 58, and sensor 52 (A) provides at a terminal 60 a voltage in proportion to the average magnetic field in its active area. Sensor 54 (B) provides at a terminal 62 a voltage in proportion to the average magnetic field in its active area. For identical Hall crosses A and B, the sum $V_A+V_B$ is zero unless there is a local field that varies on the length scale f. When f is comparable with the diameter of a MP, the MP may be proximal to A or B but not both. A MP in the vicinity of one of the sensors will generate a field in A that differs from that in B, and a nonzero measurement of the sum $V_A+V_b$ indicates the presence of the MP. Note that a difference in fabrication that results in a difference between A and B that's detected in zero or static field can be treated as an offset. The offset can be measured and stored as an initial value $V_i$, and subsequent measurements can be compared with $V_i$. In a functionally equivalent lateral geometry, Hall sensors A and B are arranged with bias current applied in series, and with transverse Hall arms on the same side of the current axis. With this embodiment, the difference $V_A-V_B$ is independent of external field and the critical dimension f is the edge to edge separation of the two contiguous Hall voltage arms. And advantage is that the voltage difference $V_A-V_B$ is typically easier to measure than the voltage sum sum $V_A+V_B$. A disadvantage is that a relatively large baseline resistance is always present. Prototypes of this kind have been made using Hall crosses fabricated from a GaAs/AlGaAs heterostructure and f=1 micron. A magnetic particle with diameter d=4 microns was attached to an AFM tip, was scanned over the surface of the gradiometer, and was detected with high signal to noise.

The above discussions of preferred embodiments are directed to Hall plates with three arms, two for current bias and one for voltage output. It is clear to those skilled in the art that Hall crosses with two arms for voltage output can also be used. The preferred embodiment that uses a single voltage output permits a higher density of integration. Although these embodiments depict Hall plates as the magnetic field sensors, it is clear to those skilled in the art that the invention refers to the realization of geometries that can be used for fabrication of integrated gradiometers, and to the use of such gradiometers. Accordingly, the invention also includes other types of magnetic field sensors, such as magnetoresistors, spin values, magnetic tunnel junctions, or patterned inductive coils, as relevant portions of the integrated gradiometer.

The embodiments discussed above depict MPs with intrinsic, spontaneous magnetic moments. The invention also includes applications where an external perturbing magnetic field can be applied to an MP in order to orient the moment in a preferred direction, to increase the size of the moment, or to develop a moment. It was stated above that it is reasonably to approximate the MP as a magnetic dipole. It is well-known that a spherical body will be a pure magnetic dipole if it is uniformly magnetized. If the MP is small enough that it can only support a single magnetic domain then the particle will be, by definition uniformly magnetized in a saturated state. However, if the MP becomes large enough it will typically form multiple magnetic domains in order to lower its magnetostatic energy. If the MP is sufficiently large so that it has a multitude of magnetic domains, each much smaller than the particle itself, the MP will then be effectively demagnetized. Such a MP is desirable when on requires non-remanence. If a magnetic field is applied, the MP will magnetize (generally parallel to the applied field) in proportion to the applied field $$M=(3/4\pi)H.$$

The above equation is the limiting case for a MP composed of material with high intrinsic susceptibility, which will generally be the case. Such a multidomain MP will be essentially dipolar in nature because the magnitude domains will spatially average over dimensions comparable to d. For MP sizes intermediate between the single domain and multiple domain dimensions, the particle will have multipole-moment components and cannot be treated as a pure dipole. However, such intermediately sized MPs are expected to be of limited use because they are neither fully saturated nor fully demagnetized.

When single magnetic domain or larger demagnetized (non-remanent) MPs are employed, the integrated gradiometer is ideally suited to detecting the presence of such MPs because the applied field is automatically nulled, and therefore does not interfere with the measurement of the field associated with the MP. This is a significant advantage over existing art, where it is difficult for a simple field sensor to discriminate the local field of a MP from the larger background field $H_a$.

Figure 5A:
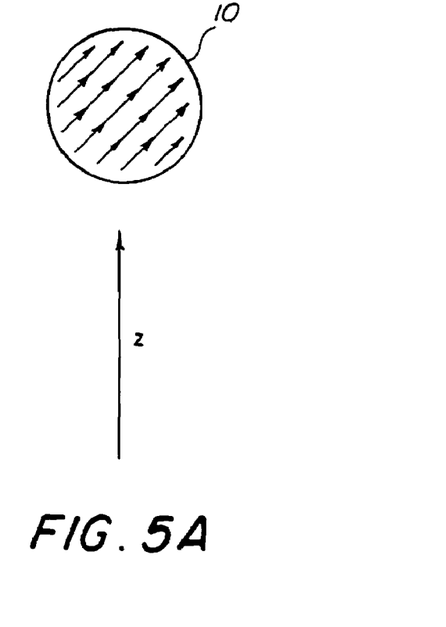
FIG. 5A shows one geometry for application of an external magnetic field to increase the moment of a magnetic particle.
Figure 5B:
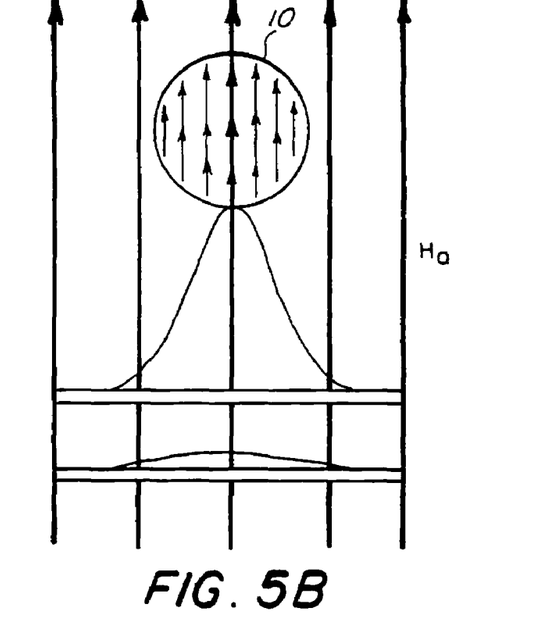
FIG. 5B shows a representation of the magnitudes of the z-component of fringe magnetic field of the magnetic particle at two vertical distances that represent the positions of two vertically stacked sensors of the device of FIG. 2.

Referring again to the vertically stacked embodiment shown in FIGS. 2 and 3, a specific application involving an external field illustrated in FIG. 5A shows a single domain MP that is magnetized along some arbitrary direction that, in general, will not be parallel to +/− z. However, by applying an external magnetic field $H_a$ along +/− z the moment of the particle can be aligned parallel to +/− z as shown in FIG. 5b. The magnetic field component from the MP will then be maximized along +/− z. If two Hall sensors 22 and 24 are stacked directly below the particle with a vertical separation t between the two sensors, the upper sensor A 24 that is closer to the MP will see a larger magnetic field than the lower sensor B 22. Taking the difference of the two Hall voltages ($V_A-V_B$) will effectively null out the applied field. However, depending upon the sensor separation t. $V_A-V_B$ can represent a substantial voltage and, therefore, a reliable signal that is proportional to the magnetic field from the MP. For example, if separation of the MP (measured from the center of the particle) from the first sensor 24 is given by l and further l~t, then the magnetic field due to the MP will be roughly an order of magnitude lower at sensor B compared to sensor A.

Figure 6:
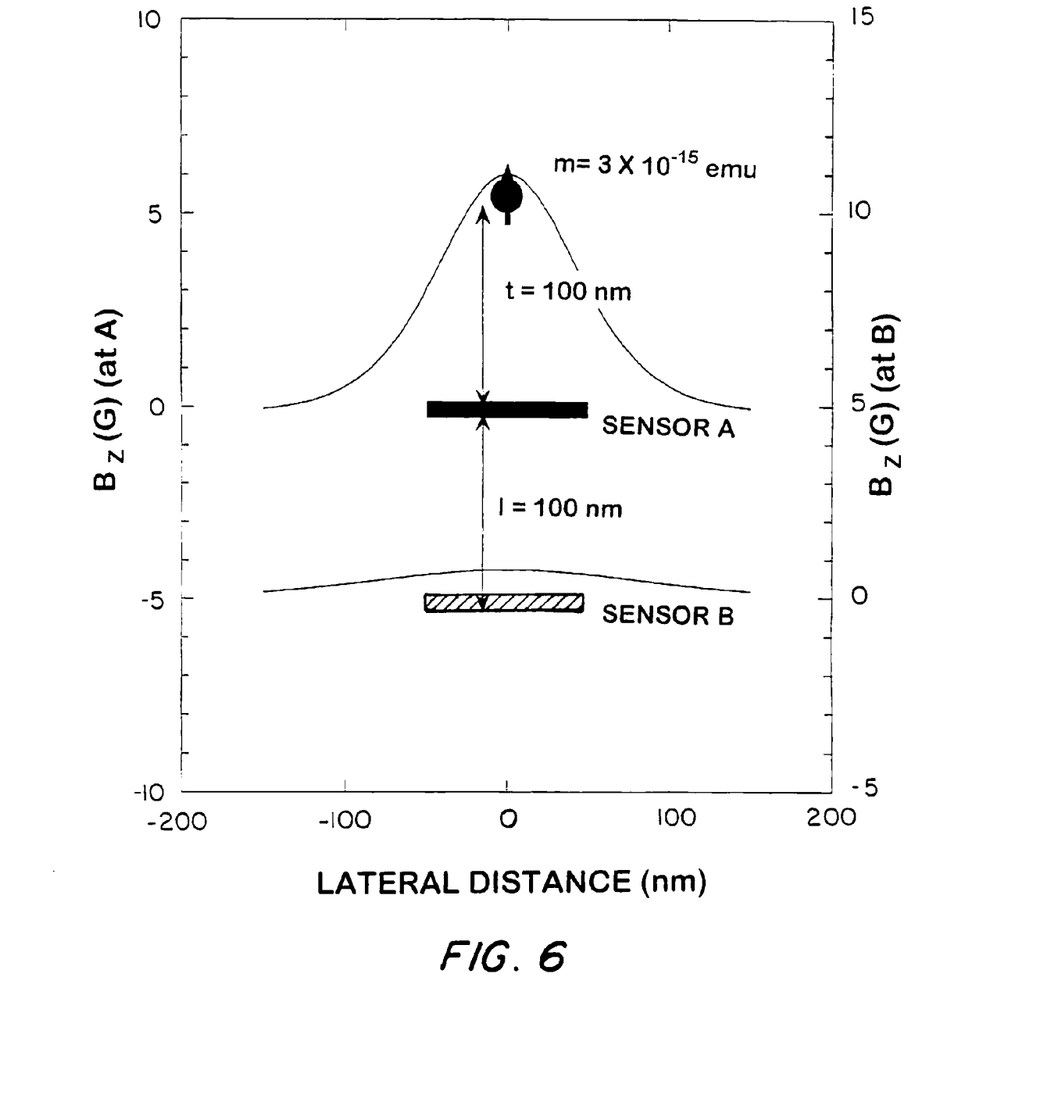
FIG. 6 shows the results of a calculation of the z-component of fringe field of a magnetic particle as a function of lateral distance, for two vertical distances that correspond to sensors A and B.

FIG. 6 shows a specific example of an MP with dipole moment of magnitude $m=3\times10^{-15}$ emu 100 nm above sensor A 24. The 100 nm separation is determined primarily by the MP immobilization chemistry. In principle, this value can be made arbitrarily large. Separations of less than 100 nm are probably very difficult, though not impossible, to achieve. The magnetic field at A is about 5 Gauss whereas at sensor B 22 (200 nm from the MP) it is about 0.5 Gauss. It is notable that even though this particle represents a magnetic moment several orders of magnitude below that generally detected by the most sensitive SQUID magnetometers, the 5 Gauss magnetic field from the source particle is readily detectable by the Hall gradiometer described above. Finally, while in the above discussion single domain particles were used, one could just as easily employ larger, demagnetized particles. In this case the externally applied magnetic field would provide the dual function of magnetizing the particle as well as (necessarily) orienting the moment parallel to that applied field.

A single integrated gradiometer could be fabricated on a chip in a geometry where local topographic features (such as ridges or troughs 42 in FIG. 3) may be used to guide MPs to the vicinity of the gradiometer. Alternatively, the integrated gradiometer could also be fabricated on a scanning stage. It could then be scanned over a sampling region, using standard techniques known to those skilled in the art.

Furthermore, we have developed novel techniques for forming two dimensional arrays of Halls cells [see, for example, Johnson, U.S. Pat. No. 5,652,445], with integrated readout and architectures for addressing each individual cell. This enables an extended application where an n dimensional array of gradiometers is fabricated. In general, n may be 1, 2 or even 3, but a typical application would involve a 2-dimensional array with contiguous cells fabricated close together to form a high density array. Each cell would include a gradiometer and an element to isolate the cell from the array of readout lines. Simple diode, such as a Schottky diode, can be used for isolating each device from the sense amplifier line that is common to each column or row. While this represents a particularly simple means for cell isolation, it is clear to those skilled in the art that a variety of devices could be used to achieve this function. With appropriate isolation, the sense voltage from the device (i,m) is transmitted to the sense amplifier and is not diminished by dissipation through the cell (i,n). Rather than scanning a gradiometer across a region that includes an object of interest, an integrated array of devices fills up a sampling area, an object is introduced onto the array, and the output values of the cells are read out in rapid succession.

An example of an application of an array of integrated gradiometers is the detection of MPs used to "tag" chemical or biological agents, discussed above. Each cell in the array may have a unique offset value, so the initial value of the array is first measured and stored in memory in an analogous method to pixel calibration of charge couple devices. Next, a molecule (or system of molecules, such as a biological agent or organism) is tagged with microscopic magnetic particles and is placed on the array. This may involve flowing a solution that contains the tagged molecules over the surface of the chip. Alternatively, such a solution may be admitted to a flow channel on or near the surface of the chip and the integrated gradiometers are fabricated in the proximity of the flow channel. Electrical current carrying straps to generate local magnetic field gradients may be used to manipulate the motion and position of the magnetic particles (D. L. Graham et al. J. Appl. Phys. 91, 7786 (2002)). At the end of this procedure, a detection sequence takes place. The local magnetic fields associated with individual particles cause a voltage response in different cells in the array, and such a measurement may be made with, or without, an applied magnetic field. The value of the array is then measured, and the subsequent data processing is simple. The initial values of the cells in the array are subtracted, and the remaining array of difference values is a map of the presence of fringe magnetic fields associated with magnetic particles. From the map, the location of particles can be identified and the molecule (or system of molecules) can be identified.

Arrays can be fabricated with many elements, e.g. on the order of $1000^2$ to $10,000^2$, and integrated readout is rapid. It follows that any array of integrated gradiometers affords a utilitarian means for mapping tagged molecules. The array can be passivated with a thin protective coating so that the object to be identified can be applied and removed, and the chip can be reused. Alternatively, even if the chip can't be reused the cost of highly integrated arrays is relatively low. Since the time required for readout is short (the order of 10 nsec per cell), the contents of the array can be read and recorded periodically, and the array can be used for studies of magnetic particle motion for appropriate samples.

Although as discussed above, other types of sensors may be used in place of or together with Hall sensors, Hall sensors are preferred because of their ease of fabrication, desirable scaling properties, and sensitivity to field components perpendicular to the substrate plane. Their intrinsic sensitivity is proportional to the Hall coefficient $R_H$, and is usually given in units of $\Omega$/Tesla. Devices fabricated using Indium Arsenide quantum wells had a typical intrinsic sensitivity of 350 $\Omega$/Tesla. For dc measurements of steady state fields, a simple sense circuit with a 0.1 mA dc current source and a digital voltmeter had a sensitivity of about 5 m$\Omega$. The corresponding field sensitivity, for static fields, is the order of 0.1 Oe. A simple liner feedback circuit can be integrated with a Hall sensor and packaged inexpensively. The resulting sensitivity of $1\times10^{-4}$ $\Omega$ corresponds to an absolute field sensitivity of order $10^{-3}$ Oe.

While the present invention has been described in terms of a preferred embodiment, it is apparent that skilled artisans could make many alterations and modifications to such embodiments without departing from the teachings of the present invention. Accordingly, it is intended that all such alterations and modifications be included within the scope and spirit of the invention as defined in the following claims.

What is claimed is:

1. An array of integrated gradiometers, comprising:
an array of cells, wherein each cell comprises:
a semiconducting substrate;
a first sensor, fabricated on the semiconducting substrate and responsive to the presence of the magnetic field, for producing a first electrical signal proportional to a first magnetic field strength of the magnetic field;
a second sensor, fabricated on the semiconducting substrate and responsive to the presence of the magnetic field, for producing a second electrical signal proportional to a second magnetic field strength of the magnetic field;
said first and second sensors being spaced apart at a distance effective for measuring a magnetic field gradient having a spatial scale of up to about 10 µm;
a comparator, for receiving and comparing said first and second electrical signals, and for producing an output representing a magnitude of the magnetic field gradient applied across said sensors;
a first conductor for transmitting current bias to the cell;
a second conductor for transmitting a sensed voltage from the cell to a sense amplifier; and
an isolation element for electrically isolated the cell from the bias and signal wires and from other cells in the array.

2. The array of claim 1, wherein the array is a one dimensional array.

3. The array of claim 1, wherein the array is a two dimensional array and includes wires to convey a bias current and readout signals.

4. The array of claim 2, further comprising:
an addressable, select transistor for each cell; and
an array of wires to apply address voltages to a select transistor of each cell.

5. The array of claim 1, where the array is fabricated near a surface that is proximal to a fluid flow channel.

* * * * *